(12) United States Patent
Höppel

(10) Patent No.: US 9,240,523 B2
(45) Date of Patent: Jan. 19, 2016

(54) METHOD FOR PRODUCING AN OPTOELECTRONIC COMPONENT, OPTOELECTRONIC COMPONENT, AND COMPONENT ARRANGEMENT HAVING A PLURALITY OF OPTOELECTRONIC COMPONENTS

(75) Inventor: Lutz Höppel, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 42 days.

(21) Appl. No.: 13/262,678

(22) PCT Filed: Apr. 3, 2009

(86) PCT No.: PCT/DE2009/000477
§ 371 (c)(1),
(2), (4) Date: Nov. 2, 2011

(87) PCT Pub. No.: WO2010/111986
PCT Pub. Date: Oct. 7, 2010

(65) Prior Publication Data
US 2012/0037930 A1 Feb. 16, 2012

(51) Int. Cl.
*H01L 29/49* (2006.01)
*H01L 33/44* (2010.01)
(Continued)

(52) U.S. Cl.
CPC ............ *H01L 33/44* (2013.01); *H01L 33/0079* (2013.01); *H01L 25/0753* (2013.01); *H01L 33/22* (2013.01); *H01L 33/30* (2013.01); *H01L 33/46* (2013.01); *H01L 2924/0002* (2013.01)

(58) Field of Classification Search
CPC .. H01L 33/30; H01L 33/46; H01L 2924/0002
USPC .............................................. 257/79, 88, 103
See application file for complete search history.

(56) References Cited

U.S. PATENT DOCUMENTS 4,011,575 A * 3/1977 Groves ............................ 257/91
5,310,602 A * 5/1994 Li et al. ......................... 428/432
(Continued)

FOREIGN PATENT DOCUMENTS

DE 196 40 594 4/1998
EP 0 905 797 8/1998
(Continued)

OTHER PUBLICATIONS

I. Schnitzer, et al., "30% External Quantum Efficiency from Surface Textured, Thin-film Light-emitting Diodes," Appl. Phys. Lett. 63 (16), Oct. 18, 1993, pp. 2174-2176.
(Continued)

*Primary Examiner* — Michael Shingleton
(74) *Attorney, Agent, or Firm* — DLA Piper LLP (US)

(57) ABSTRACT

A method for producing optoelectronic components including A) providing a growth substrate with a semiconductor layer arranged thereon that produces a zone which is active during operation, B) applying separating structures on the semiconductor layer, C) applying a multiplicity of copper layers on the semiconductor layer in regions delimited by the separating structures, D) removing the separating structures, E) applying, a protective layer at least on lateral areas of copper layers, F) applying an auxiliary substrate on the copper layers, G) removing the growth substrate, H) singulating a composite assembly comprising the semiconductor layer, the copper layers and the auxiliary substrate to form components which are separated from one another.

16 Claims, 10 Drawing Sheets

(51) Int. Cl.
*H01L 33/00* (2010.01)
*H01L 25/075* (2006.01)
*H01L 33/22* (2010.01)
*H01L 33/30* (2010.01)
*H01L 33/46* (2010.01)

(56) References Cited

U.S. PATENT DOCUMENTS

| | | | |
|---|---|---|---|
| 5,362,977 A * | 11/1994 | Hunt et al. | 257/98 |
| 5,596,231 A * | 1/1997 | Combs | 257/776 |
| 6,111,272 A | 8/2000 | Heinen | |
| 6,375,340 B1 * | 4/2002 | Biebl et al. | 362/294 |
| 6,682,950 B2 * | 1/2004 | Yang et al. | 438/47 |
| 7,700,379 B2 * | 4/2010 | Haji-Sheikh et al. | 438/14 |
| 2002/0017652 A1 | 2/2002 | Illek et al. | |
| 2002/0117399 A1 * | 8/2002 | Chen et al. | 205/125 |
| 2003/0219983 A1 * | 11/2003 | Lee | 438/694 |
| 2004/0053446 A1 * | 3/2004 | Matsubara | 438/118 |
| 2005/0151142 A1 * | 7/2005 | Imai | 257/81 |
| 2005/0242365 A1 * | 11/2005 | Yoo | 257/103 |
| 2006/0030143 A1 * | 2/2006 | Ivanov | 438/622 |
| 2007/0238282 A1 * | 10/2007 | Furman et al. | 438/612 |
| 2007/0267640 A1 * | 11/2007 | Lee et al. | 257/94 |
| 2008/0283869 A1 | 11/2008 | Noh et al. | |
| 2009/0032286 A1 * | 2/2009 | Urakawa et al. | 174/250 |
| 2009/0090928 A1 * | 4/2009 | Mori et al. | 257/99 |
| 2010/0029045 A1 * | 2/2010 | Ramanathan et al. | 438/114 |
| 2010/0032189 A1 * | 2/2010 | Muto et al. | 174/252 |
| 2010/0154213 A1 * | 6/2010 | Koike et al. | 29/874 |
| 2012/0002420 A1 * | 1/2012 | Imai et al. | 362/249.02 |
| 2012/0155087 A1 * | 6/2012 | Kim et al. | 362/249.03 |
| 2013/0153949 A1 * | 6/2013 | Yang et al. | 257/99 |
| 2013/0320217 A1 * | 12/2013 | Kawaguchi et al. | 250/361 R |
| 2014/0061913 A1 * | 3/2014 | Yeh et al. | 257/751 |
| 2014/0084472 A1 * | 3/2014 | Sun et al. | 257/751 |

FOREIGN PATENT DOCUMENTS

| | | | | |
|---|---|---|---|---|
| EP | 1039596 | * | 9/2000 | H01S 5/02 |
| JP | 2-125478 | | 5/1990 | |
| JP | 10-177974 | | 6/1998 | |
| JP | 2005-183757 | | 7/2005 | |
| JP | 2005-259910 | | 9/2005 | |
| JP | 2006-080251 | | 3/2006 | |
| JP | 2006-190851 | | 7/2006 | |
| JP | 2007-088059 | | 4/2007 | |
| JP | 2007-214480 | | 8/2007 | |
| JP | 2007-281245 | | 10/2007 | |
| JP | 2008-054865 | | 3/2008 | |
| JP | 2009-049371 | | 3/2009 | |
| JP | 2009-212357 | | 9/2009 | |
| KR | 10 2007 0008759 | | 1/2007 | |
| WO | 02/013281 | | 2/2002 | |
| WO | 2005/088743 | | 9/2005 | |
| WO | 2007/117805 | | 10/2007 | |
| WO | 2009/002045 | | 12/2008 | |

OTHER PUBLICATIONS

English translation of the Japanese Notice for Reasons for Rejection dispatched Feb. 12, 2014 from corresponding Japanese Patent Application No. 2012-502445.

English translation of Notice of Reasons for Rejection dated Sep. 8, 2015 of corresponding Japanese Application No. 2014-230666.

* cited by examiner

METHOD FOR PRODUCING AN OPTOELECTRONIC COMPONENT, OPTOELECTRONIC COMPONENT, AND COMPONENT ARRANGEMENT HAVING A PLURALITY OF OPTOELECTRONIC COMPONENTS

RELATED APPLICATIONS

This is a §371 of International Application No PCT/DE2009/000477, with an international filing date of Apr. 3, 2009 (WO 2010/111986 A1, published Oct. 7, 2010), the subject matter of which is incorporated herein by reference.

TECHNICAL FIELD

This disclosure relates to a method for producing an optoelectronic component comprising a semiconductor layer, which produces an active zone during operation, and a copper, layer as carrier substrate, which is arranged on the semiconductor layer. The disclosure furthermore relates to an optoelectronic component produced by this method and an arrangement of a plurality of optoelectronic components of this type.

BACKGROUND

It has been observed that, in the production of optoelectronic components comprising a copper substrate (which serves, in particular, as a heat sink and for mechanical stabilization), a very high number of rejects in respect of non-functional components, are produced, particularly if the optoelectronic components are light emitting diodes or laserdiodes.

Therefore, it could be helpful to provide a method with which a smaller number of rejects in respect of non-functional optoelectronic components are obtained.

SUMMARY

I provide a method for producing optoelectronic components including: A) providing a growth substrate with a semiconductor layer arranged thereon, that produces a zone which is active during operation, B) Applying separating structures on the semiconductor, layer, C) applying a multiplicity of copper layers on the semiconductor layer in regions delimited by the separating, structures, D) removing the separating structures, E) applying a protective layer at least on lateral areas of the copper layers, F) applying an auxiliary substrate on the copper layers, G) removing the growth substrate, H) singulating a composite assembly comprising the semiconductor layer, the copper layers and the auxiliary substrate to form components which are separated from one another.

I also provide the bodies wherein the nanocrystalline 3C—SiC contains amorphous carbon in an amount of 0 to 10 mass %.

I further provide a component arrangement including a plurality of optoelectronic component arranged on a common carrier layer, wherein individual components are identical or different and at least one of the components has a semiconductor layer comprising an AlGaInP layer and/or an AlGaInAs layer.

DETAILED DESCRIPTION

Figure 1:
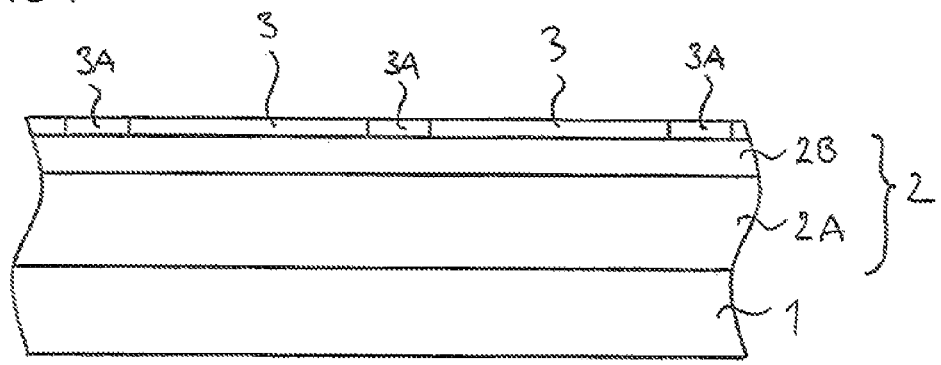
FIG. 1 shows a layer sequence composed of a growth substrate and a semiconductor layer with a mirror layer arranged thereon.

I provide a method for producing an optoelectronic component comprises the following method steps: providing a growth substrate with a semiconductor layer arranged thereon (for producing a zone which is active during operation) as method step A), applying, separating structures on the semiconductor layer in method step B), and applying a multiplicity of copper layers on the semiconductor layer in the regions delimited by the separating structures. As further method steps, the method comprises, removing the separating structures as method step D), and applying a protective layer at least on the lateral areas of the copper layers. Finally, the method comprises applying an auxiliary substrate on the copper layer in method step F), removing the growth substrate (such that the surface of the semiconductor layer is uncovered) in method step G), and singulating the composite assembly composed of the semiconductor, layer, the copper layers and the auxiliary substrate to form components which are separated from one another and which then have in each case a (in general exactly one) copper layer in method step H).

The term "component" means not only finished components such as light emitting diodes (LEDs) or laser diodes, for example, but also substrates and/or semiconductor layers, such, that, by way of example, a composite assembly composed of a copper layer and a semiconductor layer can already constitute a component and can form part of a superordinate second component, in which, for example, electrical connections are additionally present. The optoelectronic component can be, for example, a thin-film semiconductor chip, in particular a thin-film light emitting diode chip.

The optoelectronic component can be, for example, a thin-film light emitting diode chip.

A thin-film light emitting diode chip is distinguished by at least one of the following characteristic features:

a reflective layer is applied or formed at a main area—facing toward a carrier element, in particular the carrier substrate—of the radiation-generating semiconductor layer sequence, which is, in particular, a radiation-generating epitaxial layer sequence, the reflective layer reflecting at least part of the electromagnetic radiation generated in the semiconductor layer sequence back into the latter;

the thin-film light emitting diode chip has a carrier element, which is not the growth substrate on which the semiconductor layer sequence; was grown epitaxially, but rather a separate carrier element subsequently fixed to the semiconductor layer sequence;

the semiconductor layer sequence has a thickness in the range of 20 µm or less, in particular in the range of 10 µm or less;

the semiconductor layer sequence is free of a growth substrate. Free of a growth substrate means that a growth substrate used, if appropriate, for growth purposes is removed front the semiconductor layer-sequence or at least greatly thinned. In particular, it is thinned such that it is not self-supporting by itself or together with the epitaxial layer sequence, alone. The remainder of the greatly thinned growth substrate is, in particular, unsuitable as such for the function of a growth substrate, and the semiconductor layer sequence contains at least one semiconductor layer having at least one area having an intermixing structure which ideally leads to an approximately ergodic distribution of the light in the semiconductor layer sequence, i.e. that it has an as far as possible ergodically stochastic scattering behavior.

A basic principle of a thin-film light emitting diode chip is described for example in I. Schnitzer et al., Appl. Phys. Lett. 63 (16), Oct. 18, 1993, pages 2174-2176, the disclosure of which is hereby incorporated by reference. Examples of thin-film light emitting diode chips are described in EP 0905797 A2, and WO 02/13281 A1, the disclosure of which is hereby, likewise incorporated by reference.

The term "layer" can designate an individual layer or a layer sequence composed of a plurality of layers. In particular, the semiconductor layer can be a layer sequence of a plurality of layers (e.g. a sequence of a p-doped and an n-doped semiconductor layer). A mirror layer contained, if appropriate, can also consist of a sequence, of two layers or more layers. All other layers mentioned in the context of this application consist, in general, of exactly one layer, unless indicated otherwise.

The fact that one layer or one element is arranged or applied "on" or "above" another layer or another element can in this case mean here and hereinafter that said one layer or one element is arranged directly in direct mechanical and/or electrical contact on the other layer or the other element. Furthermore, it can also mean that the one layer or one element is arranged indirectly on or above the other layer or the other element. In this case, further layers and/or elements can then be arranged between said one layer and the other layer or between the one element and the other element.

The fact that one layer or one element is arranged "between" two other layers or elements can mean here and hereinafter that the one layer or one element is arranged directly in direct mechanical and/or electrical contact or in indirect contact with one of the two other layers or elements and in direct mechanical and/or electrical contact or in indirect contact with the other of the two other layers or elements. In the case of indirect contact, further layers and/or elements can then be arranged between the one layer and at least one of the two other layers or between the one element and at least one of the two other elements.

A "separating structure" is understood to mean a structure element applied on another layer to ensure that a multiplicity of further layers (separated from one another) can be applied alongside one another on the layer. Therefore, the purpose of the separating structure is, in particular, to apply copper layers which are separated from one another and not connected to one another on the semiconductor layer. Furthermore, a separating structure is understood to mean a structure composed of a material which, as soon as it has fulfilled its purpose, can be removed again (for example chemically) without the adjoining layers being damaged.

The method comprising steps A) to H) is always carried out such that the steps are implemented in the specified order. In this case, first a growth substrate is provided, on which, usually, firstly an n-doped semiconductor layer was applied and then a p-doped semiconductor layer was applied. Separating structures are, then applied on this semiconductor layer (composed e.g. of the partial layers mentioned above) such that a multiplicity of copper layers can be applied alongside one another. This step therefore involves, dividing the growth substrate with a semiconductor layer arranged thereon into regions which later (after singulation) form the individual components, which then each contain exactly one of the copper layers produced in method step C). After the copper layers have been applied, the separating structures are removed and the lateral areas of the copper layers are then provided with a protective-layer. In this base, the protective layer can completely over the copper layer, but usually only the lateral areas of the copper layers will be covered and the areas of the copper layers which run substantially parallel to the semiconductor layer will be only partly covered or not covered at all with the protective layer. However, complete covering of the copper layer is conceivable if at least that part of the protective layer which runs parallel to the semiconductor layer ensures an electrical conductivity. The areas between the individual copper layers can also be covered with the protective layer (that is to say the areas that were previously covered by the separating structures).

The "lateral" areas constitute the areas which do not run parallel to the surface of the growth substrate (and the semiconductor layer), but rather, in particular, are substantially perpendicular thereto. In particular, the lateral areas have an orientation corresponding to that of the previously applied separating structures. The lateral areas of the copper layers are therefore, in particular, the areas that previously formed a common interface with the separating structures.

In method step F) following method step E), an auxiliary substrate is applied to the copper layer; this can be effected for example by a potting material (e.g. an adhesive), which fills the trenches produced by the previously applied separating structures, with the layer composite assembly present. However, the auxiliary substrate can also be arranged directly on the copper layer (or on a protective layer applied, if appropriate, over the whole area on the copper layer. It can be arranged over the whole area directly on the protective layer and, if appropriate, the copper layer or else directly only onto that surface region of the copper layer (if appropriate provided with a protective layer) which runs substantially parallel to the semiconductor layer. Finally, in steps G) and H), the growth substrate is removed (the auxiliary substrate then ensures sufficient mechanical cohesion) and the layer composite assembly obtained up to this method step can be singulated. In this case, as a rule, the singulation is effected after the completion of the process sequence; it can be effected by the definition of mesa regions by separation pn junction and/or by fitting of an electrical contact.

The method affords the advantage that a significantly smaller number of non-functional or poorly functional components is obtained with this method. I discovered that, by applying a protective layer on the copper layer, to be precise in particular on the areas which subsequently are not covered by a further layer that is essential to the functionality of the component, it is possible to significantly reduce the proportion of short circuits in the components obtained and, as a rule, it is also possible to increase the lifetime of the component (according to the method, a layer which is essential to the functionality of the optoelectric component is understood to be a layer without which an active zone is not formed when a voltage is applied to the component. In particular, therefore, those layers through which the charge carriers are transported—that is to say the electrons and/or the holes are transported—should be noted as essential layers). It is assumed that, for the short circuits, therefore, problems first arise during soldering of the component (for instance as a result of residues of solder required for the electrical linking which are present on the lateral sides of the copper layer—that is to say in regions which were not determined for soldering—and cause a short circuit). The same correspondingly holds true if, instead of a solder, a conductive adhesive is used for the electrical linking. Second, it is assumed that the protective layer can prevent migration of copper or copper ions. In particular in specific plastics such as e.g. in thermoplastics, an intensified migration can be assumed (as in the case of silver ions). The migration then takes place in particular upon application of a voltage (which generates an electric field), wherein the copper (or the copper ions) then migrates from the copper carrier for example in the direction of a plastic housing used for the component. This can, have the effect of giving rise to a conducting path in the plastic, which can lead to fault currents or to an electrical short circuit. A thermoplastic in which such migration can take place can be contained for example in a potting compound used for the optoelectronic component. However, copper migration can also already take place without the presence of a plastic. Presumably, in the electric field the copper ions then, migrate on the surface of a part of the component. Finally, it has also been ascertained that the lifetime of the optoelectronic component can be lengthened by the protective layer—depending on the semiconductor layer used (or the partial layers used). It is assumed that a migration of copper (or copper ions) that causes damage to the semiconductor layer is also responsible for this.

The protective layer can contain organic and/or inorganic components or consist of organic or inorganic components.

If only a functionality as "soldering stop layer" or "conductive adhesive stop layer" is taken into consideration for the protective layer, then the protective layer can consist of an inorganic material, in particular a nonconducting or only semiconducting inorganic material, for example a metal salt (for example a metal oxide), or can contain it as the main constituent. Furthermore, for a soldering stop functionality, it is also possible to use an organic material (that is to say, in particular, a soldering stop resist) as protective layer. Such a "soldering stop layer" or "conductive adhesive stop layer" then has the effect that the solder or the conductive adhesive does not wet the protective layer, or wets the latter only to a very small extent; such that short circuits can be prevented.

If it is necessary to prevent copper migration (for example, on account of the potting compound used), then in particular inorganic material, in particular a metal or a metal salt (in particular a metal oxide), which prevents a diffusion of copper or copper ions, is taken into consideration as the protective layer. In an exceptional case, an organic material (in particular a thermosetting plastic) can also prevent migration of copper or copper ions. As a rule, such a protective layer against copper migration then effects a hermetic, sealing of the copper layer; thereby completely preventing migration of copper or copper ions through the protective layer.

If both a soldering stop functionality and the prevention, of copper migration are intended, then in particular protective layers which contain metal salts (in particular metal oxides) or in most cases consist thereof are suitable. In an individual case however—as described above—a thermosetting plastic is conceivable which both prevents copper migration and has soldering stop functionality.

However, the method not only affords the advantage of an improved quality of the components obtained which is achieved by the protective layer applied. The sequence of the method steps also makes it possible to produce a component wherein there is substantial freedom with regard to the concrete configuration of the semiconductor layer system (and here in particular the main area—remote from the copper layer—of the semiconductor layer or further layers arranged thereon, through which e.g. the radiation of a radiation-emitting optoelectronic component is emitted). Thus, for example, in any desired manner, an electrical contact can be applied on the surface. Further functional layers can be applied and the three-dimensional shape of the semiconductor layer (or of the layer sequence formed by the various partial layers) can also be determined only after the application of the copper layer (or heat sink). By way of example, it is possible to form a semiconductor layer whose sectional areas parallel to the two main areas decrease in size proceeding from the main area facing the copper layer (also called "upper main area" hereinafter) toward the other main area (in the case of a radiation-emitting device, therefore taper in the direction of radiation emission—therefore have a mesa structure). By contrast, components wherein the mesa structure is present in an inverse form (that is to/say wherein the sectional area tapers in the direction of the main area facing the copper layer) have reduced mechanical stability since the upper main area forms acute angles with the adjoining; areas. An increased stability and fracture strength are achieved on account of the positive mesa, edges.

Finally, the method also has the advantage that it manages with a particularly small number of steps wherein surface regions of the component have to be protected during application of a subsequent layer, e.g. by a photoresist.

In particular, the optoelectronic component can be embodied as a light emitting diode (LED) or as a laser diode, wherein the semiconductor layer has at least one active layer having, an active region suitable for emitting electromagnetic radiation.

The semiconductor chip can have, as active region in the active layer, for example, a pn junction, a double heterostructure, a single quantum well structure (SQW structures) or a multiple quantum well structure (MQW structures). The designation "quantum well structure" encompasses, in particular, any structure in which charge carriers can experience a quantization of their energy states as a result of confinement. In particular, the designation quantum well structure does not include any indication about the dimensionality of the quantization. It therefore encompasses, inter alia, quantum well, quantum wires and quantum dots and any combination of these structures. Alongside the active layer having the active region, the semiconductor layer sequence can comprise further functional layers and functional regions, selected from p- and n-doped charge carrier transport layers, that is to say electron and hole transport layers, p-, n- and undoped, confinement layers, cladding and waveguide layers, barrier layers, planarization layers, buffer layers, protective layers and electrodes and combinations of the layers mentioned.

The semiconductor layer can be embodied as an epitaxial layer sequence; that is to say as a semiconductor layer sequence grown epitaxially. In this case, the semiconductor layer sequence can be embodied as a nitride semiconductor system, in particular. The term "nitride semiconductor system" encompasses all nitride compound semiconductor materials. This can involve a semiconductor structure composed of a binary, ternary and/or quaternary compound of elements of main group III with a nitride. Examples of such materials are BN, AlGaN, GaN, InAlGaN or further MN compounds. In this sense, the semiconductor layer sequence or the semiconductor chip can be embodied on the basis of InAlGaN. InAlGaN-based semiconductor chips, and semiconductor layer sequences include, in particular, those in which the epitaxially produced semiconductor layer sequence generally comprises a layer sequence composed of different individual layers which contains at least one individual layer comprising material from the III-V compound semiconductor material system $In_xAl_yGa_{1-x-y}N$ where $0 \leq x \leq 1$, $0 \leq y \leq 1$ and $x+y \leq 1$.

Semiconductor layer sequences comprising at least one active layer based on InGaAlN can emit, for example, electromagnetic radiation in an ultraviolet to green or green-yellow wavelength range.

Furthermore, the semiconductor layer sequence can be embodied on the basis of AlGaAs for example. AlGaAs-based semiconductor chips and semiconductor layer sequences, include, in particular, those in which the epitaxially produced semiconductor layer sequence generally comprises a layer sequence composed of different individual layers which contains at least one individual layer comprising a material from the III-V compound semiconductor material system $Al_xGa_{1-x}As$ where $0 \leq x \leq 1$. In particular, an active layer comprising an AlGaAs-based material may be suitable for emitting electromagnetic radiation having one or more spectral components in a red to infrared wavelength range. Furthermore, such a material can comprise In and/or P in addition or as an alternative to the elements mentioned.

Alternatively or additionally, the semiconductor layer sequence or the semiconductor chip can also comprise compound semiconductor material systems besides of instead of the III-V compound semiconductor systems.

All the materials specified above can comprise one or a plurality of dopants and additional constituents which substantially do not change the physical properties of the material.

The copper layer applied in step C) of the method can be applied by any method for applying metal layers. In particular, for economic reasons, application by a plating method (in particular by electroless deposition or by, anodic oxidation) is expedient. By way of example, this can be effected on account of the separating structures in the form of a "slotted deposition plating". It goes without saying, however, that other methods for depositing the copper layer are also possible.

The copper layer need not be a pure copper layer, but rather can also contain additives with which an increased stiffness, a porosity or an increased stress can be realized. As a rule, it will contain additives amounting to not more than 1% by weight, usually not more than 0.5% by weight. Additives that may be, mentioned include, first, nickel additives (which, for example as an interlayer, cause a better hardness of the copper layer and hence an increased mechanical loading capacity—but require a higher proportion by weight than indicated above and, in the case of a plating method being employed, for example, have to, be produced by changing the plating bath), and, second, nonmetallic additives such as, for example, carbon, sulfur, phosphorus (which are also incorporated into the copper layer from the known additives by a plating method, wherein the incorporation rate can be influenced in general by the chosen current density and temperature).

In one example, the semiconductor layer has, on its side (also called "lower main area" hereafter) remote from the growth substrate, a reflective layer (in particular a mirror, layer) by means of which radiation generated in the optoelectronic component can be deflected in the direction of the radiation exit area. For the mirror layer it is possible to use a material comprising silver as a main constituent. The mirror layer can be applied to the semiconductor layer for example by vapor deposition, sputtering or CVD. The mirror layer can also be structured a further method step, without the semiconductor layer being structured in the process (for example by wet-chemical etching or plasma etching). A structured mirror layer has the advantage that the impression of current is reduced or entirely prevented during operation of the component at the locations at which the mirror layer was removed. Consequently, in a targeted manner, it is possible to prevent impression of current at locations where instances of shading such as conductor tracks or bonding pads lie at the opposite side of the semiconductor layer, the coupling-out side.

Furthermore, a diffusion barrier layer can be, applied, on the mirror layer, which prevents diffusion of silver or silver ions contained in the mirror layer. Such a diffusion barrier layer can consist, for example, of a material comprising TiWN and/or TiN and can be applied, for example, by sputtering, vapor deposition or CVD.

In a further example, after step A)—often directly after step A), but, if appropriate; also after step B)—a contact layer is applied to the semiconductor layer. What can be achieved with such a contact layer is, first, that the copper layer adheres better on the semiconductor layer (and, if appropriate, mirror layers arranged thereon). Second, a contact layer can also ensure that an improved deposition of the copper layer takes place (particularly in the case of deposition by means of plating). The contact layer ideally combines both requirements. In particular, layers containing gold, palladium, tin, silver, nickel or platinum or alloys of these elements are suitable as the contact layer. In particular, layers which consist of the elements or alloys are suitable in this case. Alloys that may be mentioned include, for example, gold-tin alloys (for example comprising a gold proportion of approximately 65 to 85% by weight) or else palladium-indium alloys. Application after step B) has the advantage that the contact layer is not deposited over the whole area and can then fulfill the abovementioned functions, but during singulation of the components no cut edge arises through the contact layer.

The contact layer can be up to 1 μm thick, for example. Often, however, it will have a thickness of 0.5 μm or less. For an improved plating deposition behavior, e.g. one or a few atomic layers (e.g. of palladium) may also already be sufficient. Therefore, the contact layer can also have a thickness of less than 1 nm or e.g. also a thickness of between 1 and 100 nm.

The contact layer can be applied for example by sputtering, vapor deposition or CVD methods or a similar method.

In one configuration, the component can be subjected to heat treatment after step G). The heat treatment preferably results in diffusion of the contact layer and of the copper layer such that a zone of "intermetallic compound" arises at the interface between contact layer and copper layer and the adhesion of the copper layer on the contact layer and also the semiconductor layer is thus improved. The heat treatment is expediently effected only after step E), since otherwise a surface oxidation of the copper layer would be effected by the heat treatment process and the superficial oxide layer would then have to be removed afterward. In principle, however, heat, treatment as early as after step C) would also be conceivable. The heat treatment is preferably effected at temperatures of approximately 200° C. A sufficient rate of diffusion of the metal atoms is achieved as a result. Particularly good diffusion can be noted between the copper layer and a contact layer composed of gold or a gold alloy.

In a further example, step E)—applying the protective layer—is subdivided into two substeps. E1) and E2). In this case, as method step E1), a metal layer is applied at least on the lateral areas of the copper layer. A method step at least the metal layer applied, on the lateral, areas of the copper layer is oxidized to form a metal oxide layer.

By such a method, for example, first the entire exposed surface of the copper, layer can be coated with a metal layer and afterward only the lateral partial areas of the copper layer can be oxidized to form a metal oxide layer (or the partial regions of the copper layer which, in the subsequent method, are not coated with a layer that is crucial for the functionality of the optoelectronic component).

Before the metal layer is applied, it can be expedient for the exposed surfaces of the copper layer freed of oxides formed on the surface and to be removed by plasma etching, for example. Alternatively, removal can be effected by suitable wet chemistry. The oxidation in substep E2) can be effected in a plasma furnace, for example. In this case, the metal oxide layer formed in this case need not form a fully stoichiometric metal oxide. It is also possible, particularly in the regions not near the surface, for only partial oxidation to take place, thus resulting in a non-stoichiometric metal oxide. Instead of conversion into a metal oxide, conversion into a metal nitride or an oxynitride or similar substances is also conceivable, of course.

The metal layer can be applied by the customary coating methods, for example by sputtering, vapor deposition, CVD, or else by a plating method. In the case of specific metal salts (for example metal nitrides), however, it may be expedient not to carry out the two-stage method E1), E2), but rather to apply the metal salt layer on the lateral areas of the copper layer directly in one go (for example by a CVD method where in corresponding process gases are added and corresponding precursors of the metal salt are used).

If a protective layer composed of metal oxide (of else some other metal salt such as a metal nitride, for example) is applied, then layers taken into consideration include, in particular, layers which contain as metal component one or a plurality of the following metals or in which the metal component consists of one or a plurality of these metals: aluminum, titanium, chromium, nickel and zinc. For a plurality of optoelectronic components, a protective layer produced from a metal layer composed of nickel has proved to be advantageous (in particular also from economic standpoints).

In a further example, after step G) step K1) can be effected. In this case, an electrical contact will be applied on a partial region of the surface of the semiconductor layer (Which was exposed in step G)). In principle, step K1) can also be effected at a later point in time. Usually, however, it will be effected directly after step G) (or, if appropriate, directly after step K2), described below).

In a further example, after step G) step K2) is effected. In this case, that surface of the semiconductor layer which is exposed in step G) is structured. The structuring can include introduction of trenches into the surface and/or in the roughening of the upper main area of the semiconductor layer.

Introduction of trenches into the surface can be effected by an etching method, for example. The latter is carried out, in particular such that mesa trenches arise as a result of the etching process. In particular, the mesa trenches are embodied such that the semiconductor layer previously present is subdivided into individual semiconductor structures which then corresponds to the semiconductor layer of the component obtained after singulation (step H)). As a rule, therefore, the structuring to form mesa trenches will be effected such that the mesa trenches spatially correspond to the "trenches"—applied in step B)—between the individual copper layers—such that, in particular during singulation, the individual components can be separated from one another in one step. The mesa regions can also consist of a fraction of the later chip, area, that is to say that a chip then comprises a plurality of separated semiconductor regions which, however, can in turn be electrically combined with one another.

By virtue of the fact that the mesa trenches are etched from the side of the surface which was exposed in method step G), positive mesa edges or mesa edges which form an angle of 90° with the surface are obtained. That means that the mesa trenches produced by the etching process taper as viewed from the "area" that was previously connected to the growth substrate toward the other layers. By contrast, the mesa itself, that is to say in particular the semiconductor layer, widens as viewed from the upper main area. The sidewalls of the mesa trenches are, in particular, slightly oblique and do not run perpendicularly to the surface, which is the consequence of a wet etching method. Angles of approximately 90° can be obtained by means of a dry etching method, for example.

A positive mesa edge does not only have mechanical advantages. Certain improvements in light emission in the case of a radiation-emitting component are also possible.

Structuring of the surface of the semiconductor layer can also include roughening of the surface. By a surface roughened in this way, it is possible—in the case of a radiation-emitting component—to achieve improved coupling-out of radiation. Roughening of the surface can likewise be effected by an etching process.

In one example, the optoelectronic component comprises a semiconductor layer arranged on a copper layer as a carrier substrate. In this case, a protective layer is arranged at least on the lateral areas of the copper layer.

During operation of the optoelectronic component, formation of an active particular for emission of radiation, occurs in the semiconductor layer. The protective layer arranged on the lateral areas of the copper layer makes it possible to prevent short circuits and/or to lengthen the lifetime of the component. In particular, it should be assumed that the protective layer prevents a migration of copper or copper ions and/or serves as soldering stop functionality or as a conductive adhesive stop layer.

In one example, the protective layer contains nickel, in particular in the form of nickel oxide.

In a further example, the semiconductor layer comprises an AlGaInP layer and/or an AlGaInAs layer. As mentioned above, the semiconductor layer can consist of a plurality of partial layers and one or both of the abovementioned layers can be one of the partial layers. An AlGaInP or AlGaInAs layer is understood to be a layer based on AlGaInP, or AlGaInAs, respectively. According, to the invention, such a layer is therefore defined as follows: the layer comprises at least one material $Al_xGa_yIn_{1-x-y}P$ or $Al_xGa_yIn_{1-x-y}As$ where $0 \leq x \leq 1$, $0 \leq y \leq 1$ and $x+y \leq 1$. In this case, the material need not necessarily have a mathematically exact composition according to the above formula. Rather, it can comprise one or a plurality of dopants and additional substituents which do not functionally change the physical properties of the material. Components comprising such layers can emit e.g. green to red light, in particular red, yellow or orange light.

I observed that optoelectronic components containing an AlGaInP or AlGaInAs layer yield a, particularly high level of rejects in respect of non-functional or poorly functional components, unless my protective layer is included. It is therefore assumed that these layers can be damaged particularly easily by copper migration, which ultimately has the effect that the semiconductor layer can no longer fulfill its function and, for example, the LED no longer emits light or emits light only with weaker power.

In further examples, the optoelectronic component has, directly on the main area of the copper layer which faces the semiconductor layer, a contact layer, in particular a contact layer composed of gold, palladium, platinum or an alloy of these elements. Independently thereof; the component can have a mirror layer on that side of the semiconductor layer which faces the copper layer. Usually, the mirror layer is then arranged directly on the semiconductor layer. If appropriate, a diffusion barrier, layer is arranged on that side of the mirror layer which faces the copper layer.

Finally, I provide a component arrangement comprising a plurality of optoelectronic components which are mechanically interconnected with one another (that is to say are connected to one another cohesively, in a force-locking or in a positively locking manner). In particular, the optoelectronic components are arranged in a common housing such that in principle, a diffusion path for ions (for example, silver or copper ions) is available between the individual optoelectronic components of the component arrangement. The components can be arranged, in particular, on a common carrier material, which preferably together with the housing completely encloses the arrangement composed of semiconductor layer and copper layer. Furthermore, the individual components can be connected to one another by a potting compound. Such a component arrangement is furthermore characterized in that the individual optoelectronic components can be identical or different (for example can emit light in different colors) wherein, for example, one of the components contained in the component arrangement can comprise a semiconductor layer comprising an AlGaInP and/or AlGaInAs layer.

A component arrangement of this type makes it possible to lengthen the lifetime of the particularly sensitive components comprising an AlGaInP or AlGaInAs layer and thus to significantly lengthen the lifetime of the component arrangement overall. A diffusion of copper or copper ions from a first optoelectronic component of this component arrangement into a second optoelectronic component, comprising an AlGaInP and/or AlGaInAs, is evidently to be prevented by the protective layers.

The (individual) component often also has the above-described arrangement composed of carrier substrate and housing. In this case, the optoelectronic component itself need not necessarily be the sole functional element in the housing— other functional elements (for example functional elements which register the operating state of the component and continuously control the latter, temperature sensors and/or light sensors) can also be contained.

FIG. 1 shows a schematic side view of the layer sequence provided in method step A). The layer sequence comprises three layers (wherein, the semiconductor layer 2 is subdivided into two partial layers) with the layer sequence growth substrate 1, n-doped semiconductor layer 2a, (for example n-doped gallium nitride layer), p-doped semiconductor layer 2b (for example p-doped gallium nitride layer), mirror layer 3. In this case, the mirror layer can be interrupted by diffusion barrier regions 3a (which can consist of $SiO_2$, for example).

A substrate composed of GaP, GaN, SiC, Si, Ge or composed of sapphire is taken into consideration as the growth substrate. A substrate composed of sapphire or silicon will often be used.

Figure 2:
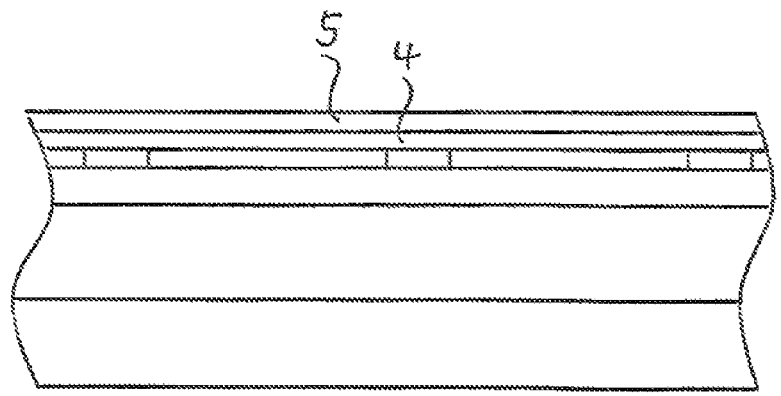
FIG. 2 shows the layer sequence from FIG. 1 on which a diffusion barrier layer and a contact layer are additionally applied.

FIG. 2 shows a side view after the application of a diffusion barrier layer 4 (which, in particular is intended to prevent the migration of silver ions, of the mirror layer) and a contact layer 5 (which, in particular, serves as a seed layer for the copper layer is subsequently to be applied). The contact layer 5 can consist, for example, of gold or a gold-tin alloy.

The diffusion barrier layer 4 can consist of nickel, for example. To ensure an ohmic connection to the subsequent layers, it is therefore often expedient to carry out ion precleaning, during which, on the surface of such a nickel layer (or of some other metal layer) (which is used as a diffusion barrier layer), to remove the natural oxide of the respective metal. This step can be carried out in situ before the contact layer 5 is applied.

Figure 3:
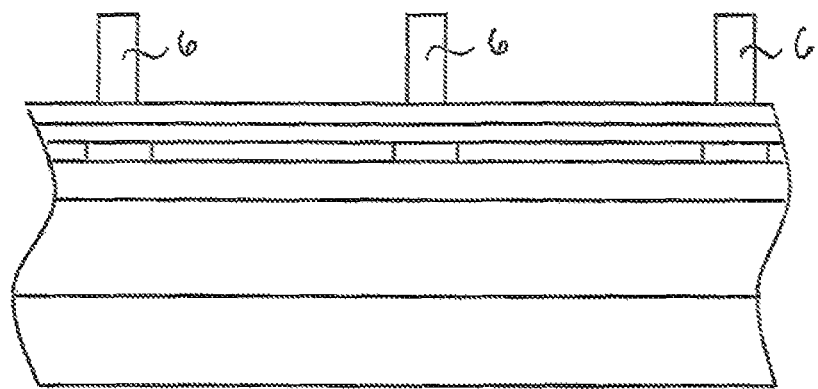
FIG. 3 shows a layer sequence in accordance with FIG. 2 wherein separating strictures are additionally applied.

FIG. 3 shows a schematic side view of an example such as could emerge from FIG. 2. In this case, separating structures 6 were applied to the contact layer 5. The separating structures 6 are provided, in particular, for separating the copper layers for the individual optoelectronic components from one another, their position corresponds to the diffusion barrier regions 3a.

The separating structures are formed, in particular, from a material which prevents a metallic layer from being deposited on the surface of this separating structure material during a plating deposition method. The separating structures therefore have the effect that the metallic layer is deposited only between the vertical sides of the separating structure on the respective area arranged horizontally between these separating structures the contact layer 5 in the present case). The separating structure can consist of a nonconductive material, in particular, and can be photosensitive or non-photosensitive. Suitable materials for such a separating structure comprise polymers, polyimides, epoxy resins; photoresists, thermoplastic compounds, parylene and similar materials.

Figure 4:
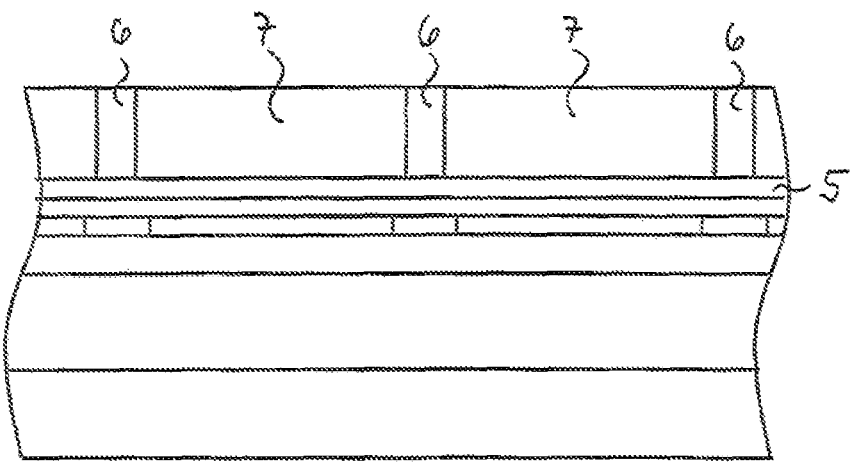
FIG. 4 shows the layer composite assembly from FIG. 3 with copper layers arranged between the separating structures.

FIG. 4 shows a schematic side view wherein a copper layer 7 was introduced between the separating structures shown in FIG. 3. The copper layer 7 can be applied by plating, in particular, wherein the contact layer 5 fosters an accelerated deposition and acts as a seed layer.

Figure 5:
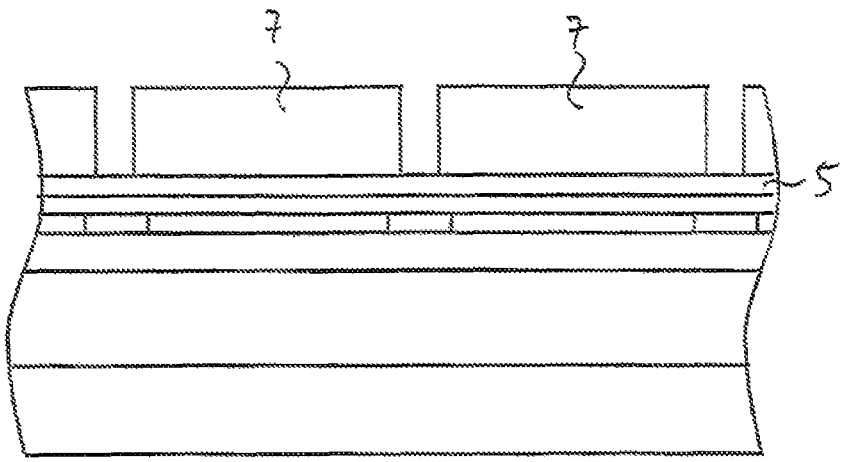
FIG. 5 shows the layer composite assembly after the removal of the separating structures.

FIG. 5 shows a schematic side view of an example of a layer arrangement wherein the separating structures 6 shown in FIG. 4 were removed again. Therefore, trenches are formed between the copper layers 7, through which trenches the cutting plane will run during subsequent singulation. The trenches therefore correspond to the diffusion barrier regions 3a.

Figure 6:
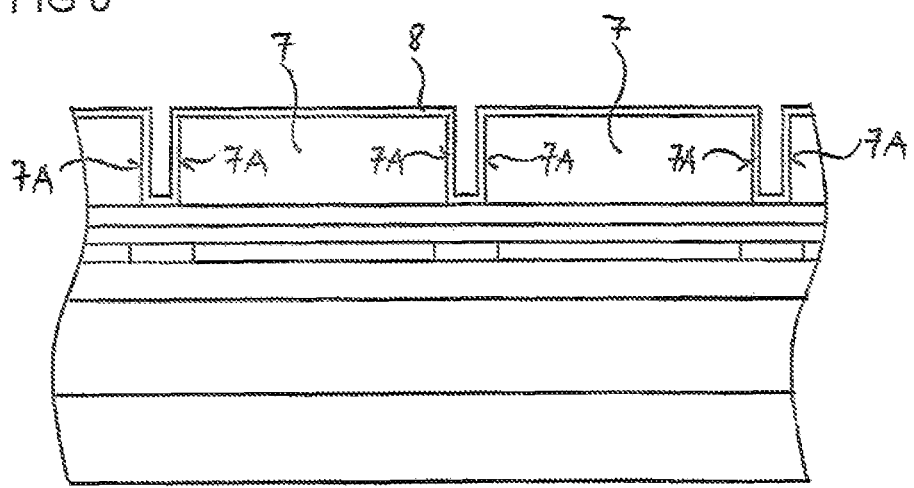
FIG. 6 shows the layer composite assembly in accordance with FIG. 5 after the application of the metal layer.

FIG. 6 shows a schematic side view of an example wherein a metal layer 8 was deposited on the layer arrangement in accordance with FIG. 5. In this case, the layer deposition method was carried out such that the lateral areas 7a of the copper layer 7 are also covered completely with the metal layer 8.

In this case, the thickness of the metal layer 8 is usually 1 to 6 μm. A layer thickness of 2 to 3, for example 3 μm will often be chosen. However, layer thicknesses of 200 nm can also already fulfill the purpose intended with the protective layer 11 produced from the metal layer. Layer thicknesses of greater than 6 μm are often less well suited, for production engineering reasons.

Figure 7:
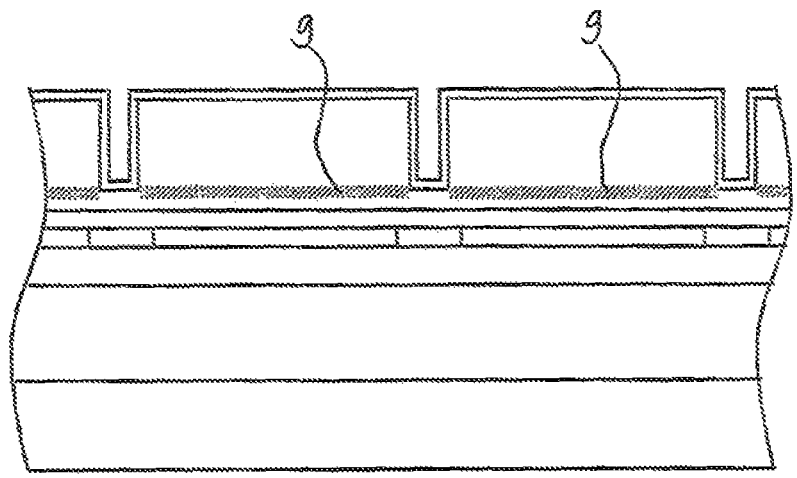
FIG. 7 shows the layer composite assembly after heat treatment.

FIG. 7 shows a schematic side view of an example of a layer arrangement in accordance with FIG. 6 wherein the layer system was subjected to heat treatment such that diffusion takes place between copper layer 7 and contact layer 5. If, by way of example, the contact layer consists of gold or of a gold alloy, an "intermixing" of gold and copper takes place at the interface and an intermetallic compound is effected (in which, however, a statistical distribution of the different types of atoms is present and a genuine alloy in the sense of a chemical compound having a defined melting point does not arise). The heat treatment, yields a "diffusion layer" 9, which leads to improved-adhesion of the copper layer on the layer. The heat treatment can be carried out for example at a temperature of 100 to 200° C., often 180 to 200° C., for a time of 30 minutes to 1 hour.

Figure 8:
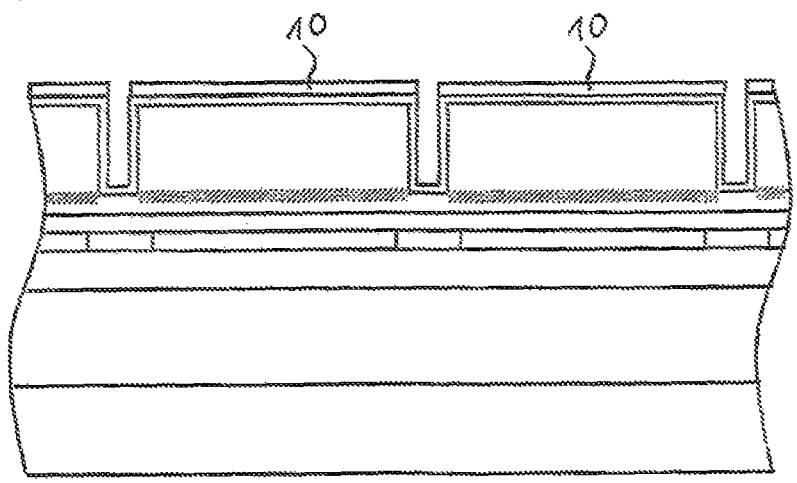
FIG. 8 shows, the layer composite assembly in accordance with FIG. 7 wherein a rear side contact is applied.

FIG. 8 shows a schematic side view of the layer arrangement in accordance with FIG. 7 wherein a rear side contact 10 was applied. In this case, the rear side contact can be composed, for example, of an electrically conductive noble metal and/or, in particular materials which are suitable for a process of soldering the chip onto a contact area. Mention may be made for example of materials which consist of gold, silver, tin, nickel and/or alloys of these metals or contain the above-mentioned metals and/or alloys as the main constituent. As already described with regard to the diffusion barrier layer 4 and the contact layer 5, for the purpose of better adhesion the surface of the metal layer 8 can in this case be subjected to ion precleaning in order to remove surface oxide that has formed.

Figure 9:
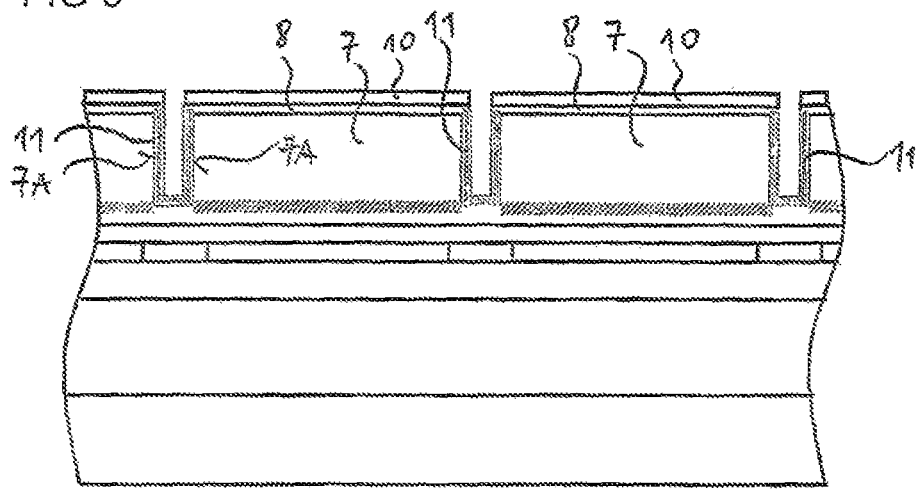
FIG. 9 shows the state of the layer composite assembly after oxidation of the protective layer on the lateral areas of the copper layer.

The schematic side view of the layer arrangement as shown in FIG. 9 shows the state after carrying out method step E) or E2). In this case, the metal layer 8 arranged on the lateral side areas 7a of the copper layer 7 were oxidized to form a protective layer 11 composed of metal oxide. The oxidation can be effected in a plasma furnace, for example. To prevent an oxidation of the metal layer 8 arranged on horizontal areas of the copper layer, instead of the rear side, contact layer shown in FIG. 8, it is also possible to apply any desired further protective layer in particular a layer which can be applied only to the area to be protected. The high directionality of a vapor deposition process can be utilized for this purpose.

Figure 10:
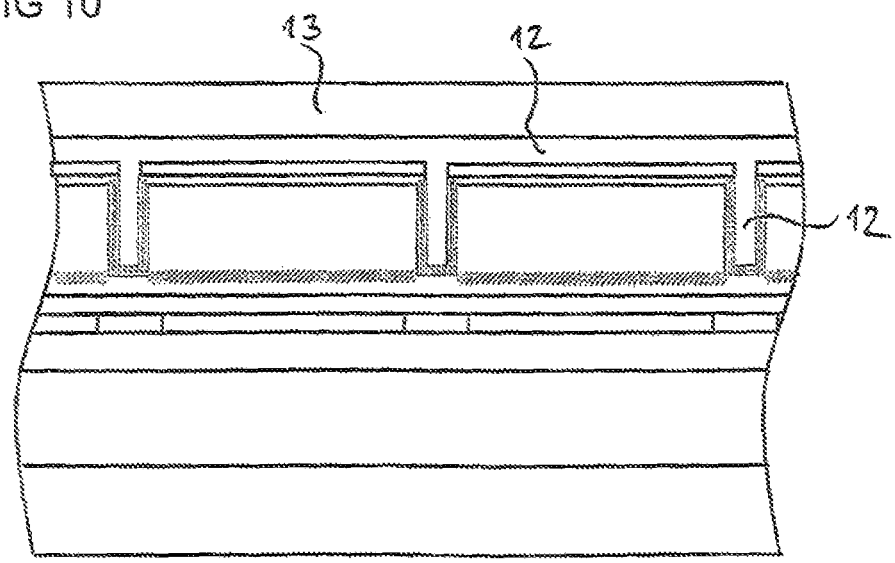
FIG. 10 shows the layer sequence in accordance with FIG. 9 with an auxiliary substrate having been applied.

FIG. 10 shows a schematic side view of a layer arrangement where an auxiliary substrate 13 was applied on the arrangement shown in FIG. 10. In this case the auxiliary substrate 13 is fixed on the layer arrangement by means of an adhesive 12, which can also fill the interspaces between the metal layers 7 (which were brought about by the separating structures 6). The auxiliary substrate often has a thickness of between −5 μm and 1,000 μm. Any material is suitable, that is to say also electrical conductive material such as metals, or non-conductors, such as sapphire, for example. The auxiliary substrate serves to stabilize the sequence to enable growth substrate to be removed.

Figure 11:
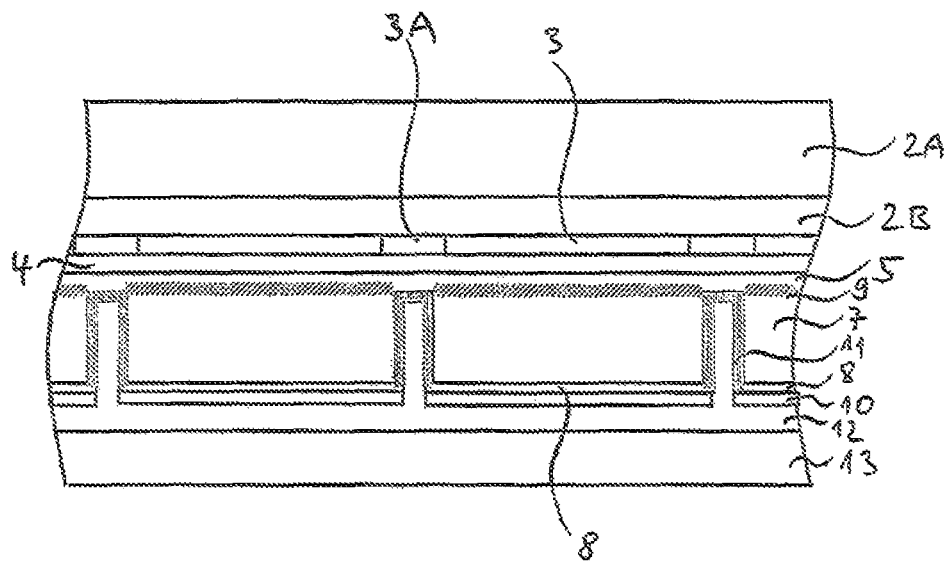
FIG. 11 shows the layer sequence after the removal of the growth substrate.

FIG. 11 shows a schematic side view of an example, of the layer arrangement in accordance with FIG. 10 (which was rotated by 180°) after the removal of the growth substrate 1. In this case, the growth substrate can be removed by means of laser lift-off (LLO), for example.

During laser lift-off (LLO), the substrate which is intended to be detached from the other layers is irradiated using a pulsed or non-pulsed, laser that penetrates through the substrate. This results in the heating of the surface of the semiconductor, layer which is adjacent to the substrate. Once the necessary temperature has been reached, the substrate is, separated off. A method for separating substrate and semiconductor layer by laser lift-off is explained for example in DE 19640594 A1, the disclosure of which is hereby incorporated by reference. In the case of silicon as growth substrate, for example, it is also possible to use a predominantly chemical removal method which stops selectively on the semiconductor layers.

Figure 12:
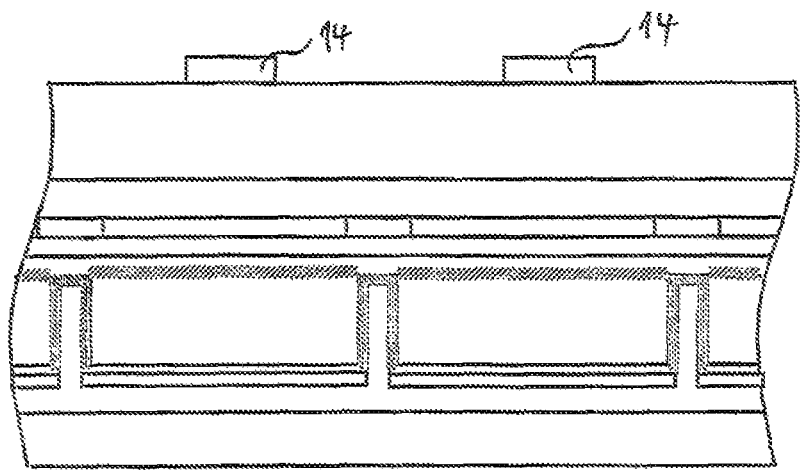
FIG. 12 shows the layer sequence with a contact-connected surface.

After the lift-off of, the growth substrate 1, that side of the semiconductor layer 2 which is exposed as a result is processed to completion. In this case, by way of example, electrical contact structures 14 (for example bonding pads) can be applied. This corresponds to method step K1), or FIG. 12.

Figure 13:
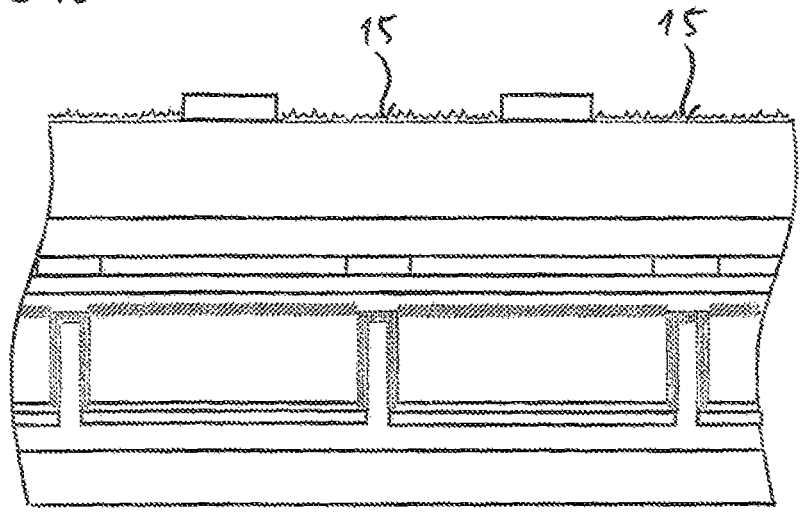
FIG. 13 shows the layer sequence with a roughened semiconductor layer.

FIG. 13 shows a schematic side view of the layer arrangement wherein the exposed side of the semiconductor layer 2 was roughened (for example by means of potassium hydroxide), thus giving rise to an irregular surface 15 of the semiconductor layer, which ensures improved coupling-out of radiation.

Figure 14:
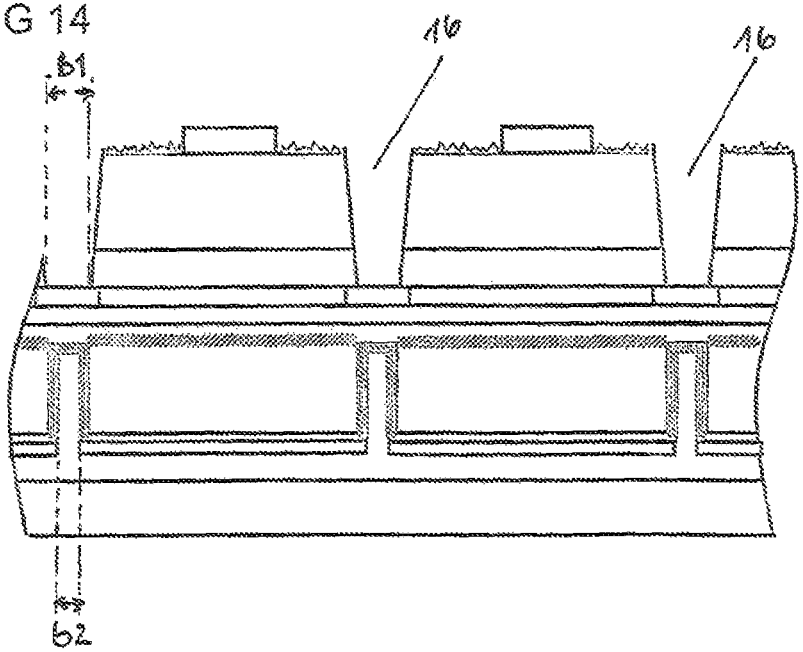
FIG. 14 shows the layer sequence with a mesa trench.

FIG. 14 shows the state of the layer system after the structuring of the surface 15 of the semiconductor layer 2 can be effected, for example, by masking and etching. In this case, a multiplicity of trenches 16 (or mesas) are obtained and the previously continuous semiconductor layer 2 is subdivided into individual layers (or partial layer stacks). In this case, the spatial arrangement of the trenches 16 corresponds to the arrangement of the interspaces between the copper layers 7, the interspaces being produced by the separating structures 6. In this case, the trenches 16 taper in the direction of the copper layer; positive mesa edges—as shown in FIG. 14—are obtained as a result.

In one example, the width b1 of the trench 16 is greater than that of the "trench" b2 present between the individual copper layers. As a result, a component is obtained where the width of the copper layer is greater than that of the semiconductor layer. This leads to an additional mechanical stabilization of the component. In this case, the width b1 as a rule, at least 22 μm; the width b2 is usually at least 30 μm. The width b1 is often between 40 and 50 μm, for example 43 and 47 μm, and the width b2 is between 30 and 40 μm, often between 33 and 37 μm. Such widths b1 and b2 ensure that the various layers and protective layers of the semiconductor component are not damaged in a later singulation process.

Figure 15:
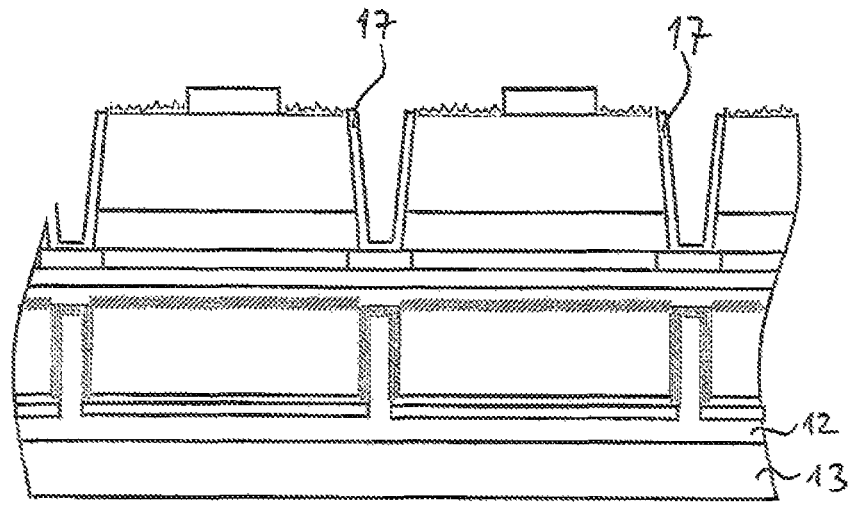
FIG. 15 shows the layer sequence with a covering layer.

FIG. 15 shows a schematic, side view of a further example. In this case, the surfaces of the trenches 16 were provided with a covering layer 17. In this case, the covering layer 17 serves for passivation and for protection of the semiconductor layer 2 and was applied such that the electrical contact structures 14 are still free such that electrical contact-connection is possible.

Figure 16:
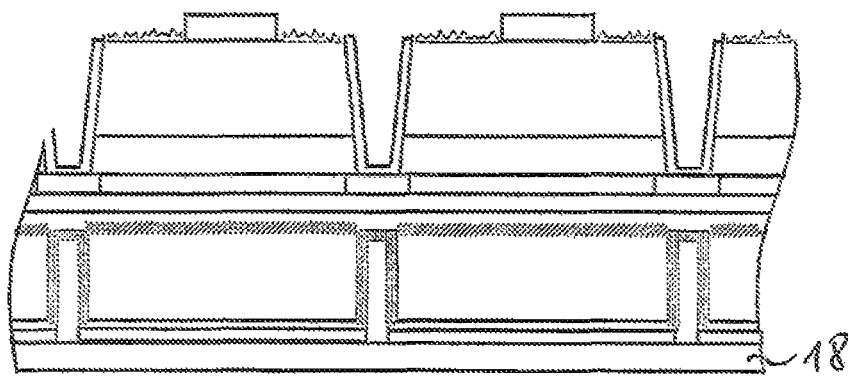
FIG. 16 shows the layer sequence after transfer to an elastic substrate.

FIG. 16 shows the state after removal of the auxiliary substrate 13 and of an adhesive layer 12 possibly contained. In this case, the auxiliary substrate was replaced by an elastic substrate 18 which, after the singulation step has been carried out, allows the elastic substrate to be stretched and, consequently, better further processing of the singulated optoelectronic components is possible.

Figure 17:
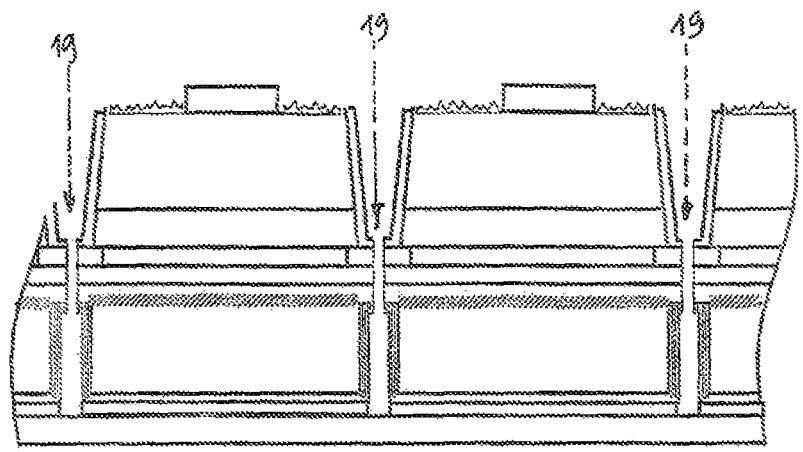
FIG. 17 shows the schematic view of singulated components of an elastic substrate.

FIG. 17 shows a schematic side view of an example after method step H) has been carried out. In this case, the optoelectronic components were separated from one another by a separating method in the direction of the arrow 19. In this case, the singulation can be effected for example by sawing (that is to say mechanically) or by a laser. The use of a laser has the advantage that the kerf formed can be only approximately 9 μm wide, thus resulting in a particularly optimized method. Moreover, the cutting by a laser is particularly precise.

Figure 18:
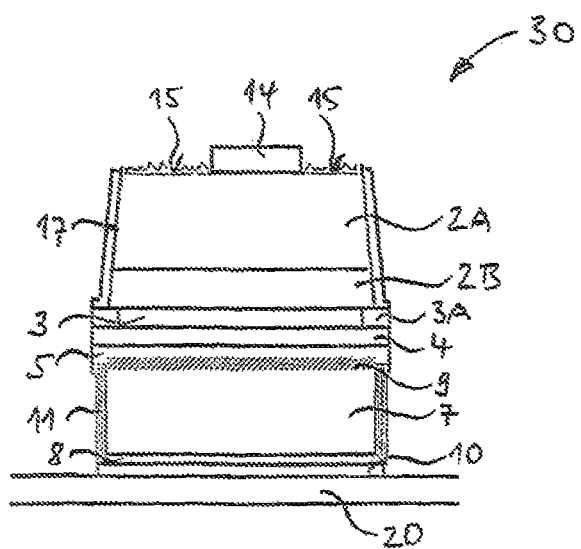
FIG. 18 shows a schematic view of a singulated component on a printed circuit board.

FIG. 18 shows a schematic side view of an example of the optoelectronic component 30 arranged on a printed circuit board 20. FIG. 18 has, proceeding from the printed circuit board 20, the following layer structure: rear side contact layer 10, metal layer 8, copper layer 7 with protective layer 11 arranged on the side areas 7a, diffusion layer 9, contact layer 5, diffusion barrier layer 4, mirror layer 3 with laterally arranged diffusion battier regions 3a, semiconductor layer 2 (with the partial layers 2a and 2b) and the laterally arranged covering layer 17, electrical contact structure 14.

Figure 19A:
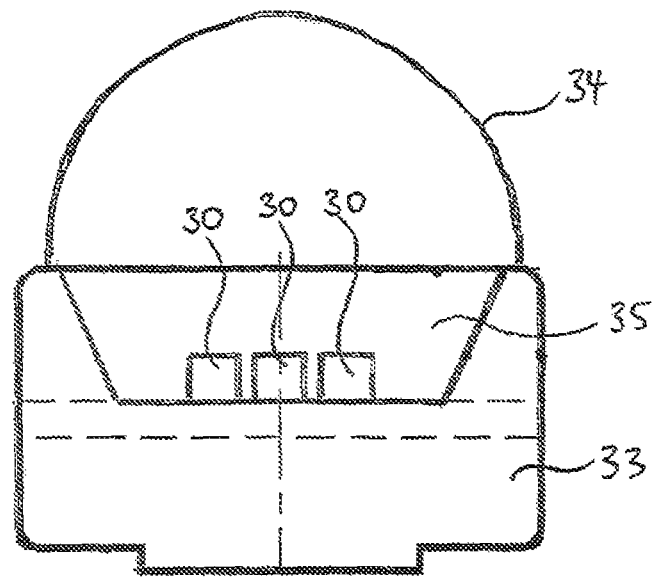
FIGS. 19A and B show a schematic view of a component arrangement comprising three optoelectronic components on a common carrier in side view and in plan view.
Figure 19B:
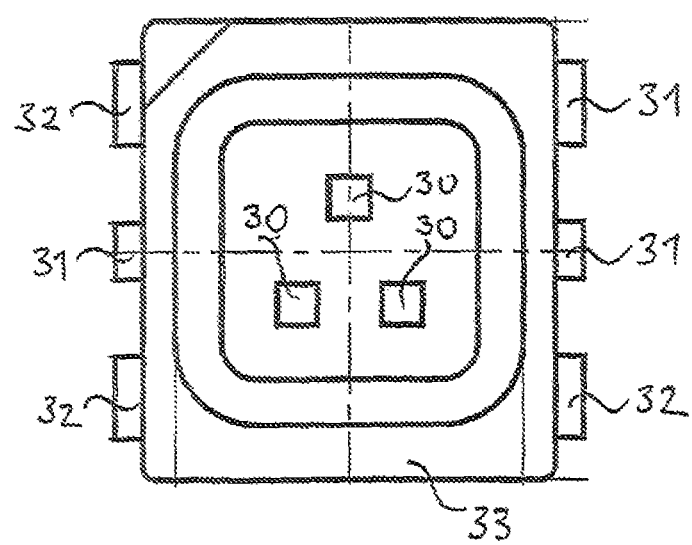

FIGS. 19A and 19B show a schematic view of a component arrangement comprising three optoelectronic components 30 in side view (FIG. 19A) and in plan view (FIG. 19B).

FIG. 19A shows an arrangement comprising a carrier element 33 wherein the optoelectronic components (here LEDs) 30 are arranged in a reflector cavity 35 as carrier element 33. In this case, the reflector cavity can be filled with a potting compound and/or have a radiation-reflecting surface. Furthermore, the component has a transparent housing 34. Electrical contact can be made with LEDs by means of a bonding wire (not shown, here). However, contact can also be made from the underside of the LED, chip, such that no bonding wire is required. The three light emitting diodes 30 can emit light for example in three different colors (for instance blue, green and yellow-orange).

FIG. 19B shows the example in accordance with FIG. 19A in plan view. This reveals the arrangement of the three light emitting diodes 30 in the reflector cavity 35 and also the electrical connections (anodes 31 and cathodes 32) which enable the different light emitting; diodes to be driven separately.

An optoelectronic component in the form of an individual LED can be embodied in accordance with FIGS. 19A and 19B, wherein only two electrical connections (and one optoelectronic component 30) are necessary.

My components and methods are not restricted by the description on the basis of the examples. Rather, the disclosure encompasses any novel feature and also any combination of features, which in particular includes any combination of features in the appended patent claims, even if features or combination itself are/is not explicitly specified in the claims or examples.

The invention claimed is:

1. An optoelectronic component comprising a semiconductor layer arranged on a copper layer, wherein
   the copper layer is formed as a carrier substrate for the semiconductor layer,
   an entire exposed surface of the copper layer having horizontal and lateral surfaces is coated with a metal layer, wherein the lateral areas of the copper layer are covered completely with the metal layer, and
   only lateral portions of the metal layer covering the lateral areas of the copper layer are oxidized so that a protective layer is formed on the lateral areas of the copper layer, wherein the protective layer is a metal oxide layer which prevents copper migration into the semiconductor layer.

2. The component of claim 1, wherein the metal layer covering the horizontal area of the copper layer is not oxidized and is attached to a rear side contact layer.

3. The component of claim 1, wherein the copper layer is a plated layer applied onto a contact layer, and the contact layer acts as a seed layer and is arranged between the semiconductor layer and the copper layer.

4. The optoelectronic component according to claim 1, wherein the protective layer contains nickel.

5. The optoelectronic component according to claim 1, wherein the at least one semiconductor layer comprises an AlGaInP layer and/or an AlGaInAs layer.

6. The optoelectronic component according to claim 1, further comprising at least one contact layer arranged on one main side of the copper layer facing the semiconductor layer.

7. The optoelectronic component according to claim 6, wherein the contact layer comprises a solder selected from the group consisting of gold, palladium, platinum, tin, silver, nickel and alloys thereof.

8. The optoelectronic component according to claim 1, further comprising a mirror layer arranged on a side of the semiconductor layer which faces the copper layer.

9. The optoelectronic component according to claim 8, further comprising a diffusion barrier layer arranged on a side of the mirror layer which faces the copper layer.

10. The optoelectronic component according to claim 1, further comprising a rear side contact.

11. A component arrangement comprising a plurality of the optoelectronic components according to claim 1 arranged on a common carrier layer, wherein individual components are identical or different and at least one of the components has a semiconductor layer comprising an AlGaInP layer and/or an AlGaInAs layer.

12. The optoelectronic component according to claim 8, wherein the mirror layer is structured so that an injection of current is reduced or entirely prevented during operation of the component at structured locations of the mirror layer.

13. The optoelectronic component of claim 1, wherein the component is a thin-film semiconductor chip which is free of a growth substrate and the semiconductor layer sequence has a thickness of 20 μm or less.

14. The optoelectronic component of claim 1, further comprising a contact layer arranged between the copper layer and the semiconductor layer sequence and connected to the copper layer and a semiconductor layer of the semiconductor layer sequence, wherein the contact layer has a thickness of 1 nm to 100 nm.

15. The thin-film semiconductor chip according to claim 1, further comprising a rear side contact, wherein the copper layer is arranged between the rear side contact and the semiconductor layer sequence.

16. The thin-film semiconductor chip according to claim 1, further comprising a mirror layer arranged between the copper layer and the semiconductor layer sequence and structured so that an injection of current is reduced or entirely prevented during operation of the component at structured locations of the mirror layer.

* * * * *